(12) United States Patent
Vinh et al.

(10) Patent No.: US 6,603,333 B2
(45) Date of Patent: Aug. 5, 2003

(54) METHOD AND APPARATUS FOR REDUCTION OF NOISE SENSITIVITY IN DYNAMIC LOGIC CIRCUITS

(75) Inventors: James Vinh, San Jose, CA (US); Pranjal Srivastava, Los Gatos, CA (US); Robert S. Grondalski, Austin, TX (US); Ajay Naini, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/731,327

(22) Filed: Dec. 5, 2000

(65) Prior Publication Data

US 2002/0067188 A1 Jun. 6, 2002

(51) Int. Cl.$^7$ ............................................... H03K 19/96
(52) U.S. Cl. ............................................. 326/98; 326/95
(58) Field of Search ...................................... 326/95–98

(56) References Cited

U.S. PATENT DOCUMENTS

| | | | |
|---|---|---|---|
| 3,935,474 A | 1/1976 | Komarek | 307/205 |
| 5,208,489 A | 5/1993 | Houston | 307/451 |
| 5,828,234 A | 10/1998 | Sprague | 326/98 |
| 5,880,986 A | 3/1999 | Dedhia | 364/784.05 |
| 6,002,271 A * | 12/1999 | Chu et al. | 326/98 |
| 6,094,072 A * | 7/2000 | Davies et al. | 326/98 |
| 6,104,212 A | 8/2000 | Curran | 326/95 |
| 6,163,173 A | 12/2000 | Storino et al. | 326/98 |
| 6,169,422 B1 | 1/2001 | Harris et al. | 326/98 |

OTHER PUBLICATIONS

Vinh et al., U.S. patent application No. 09/502,180, "Method and Apparatus For a Family of Self Clocked Dynamic Circiuts", filed Feb. 10, 2000.

* cited by examiner

*Primary Examiner*—Michael Tokar
*Assistant Examiner*—Anh Tran
(74) *Attorney, Agent, or Firm*—Fenwick & West LLP

(57) ABSTRACT

A method and apparatus for protecting dynamic logic circuits from the effects of noise at the inputs to the dynamic logic circuits is disclosed. Parallel current flow or evaluate paths which couple an output node through a common node to a low voltage or ground rail include extra transistors in the current flow or evaluate path to allow the inputs to be protected while maintaining the operation and integrity of the circuit.

10 Claims, 7 Drawing Sheets

| A | B | C | D |
|---|---|---|---|
| 0 | 0 | 0 | 1 |
| 1 | 0 | 0 | ① |
| 0 | 1 | 0 | ① |
| 0 | 0 | 1 | ① |
| 0 | 1 | 1 | ? |
| 1 | 1 | 0 | ? |
| 1 | 1 | 1 | 0 |

FIG. 5

| A | B | C | X | Y | Z | 0 |
|---|---|---|---|---|---|---|
| 0 | 0 | 0 | 1 | 1 | 1 | 1 |
| 0 | 0 | 1 | 1 | 1 | 0 | 0 |
| 0 | 1 | 0 | 1 | 0 | 1 | 0 |
| 0 | 1 | 1 | 1 | 0 | 0 | 0 |
| 1 | 0 | 0 | 0 | 1 | 1 | 0 |
| 1 | 0 | 1 | 0 | 1 | 0 | 0 |
| 1 | 1 | 0 | 0 | 0 | 1 | 0 |
| 1 | 1 | 1 | 0 | 0 | 0 | 0 |
|   |   |   |   |   |   |   |

FIG. 7

METHOD AND APPARATUS FOR REDUCTION OF NOISE SENSITIVITY IN DYNAMIC LOGIC CIRCUITS

FIELD OF THE INVENTION

This invention relates to the field of dynamic logic circuits. More particularly, this invention relates to techniques for protecting dynamic logic circuits from noise at the inputs.

BACKGROUND OF THE INVENTION

Dynamic logic circuits are designed to operate at high speeds. They operate in two phases or cycles, a pre-charge phase or cycle and an evaluate phase or cycle. During the precharge phase or cycle, the voltage level at an output node of the dynamic logic circuit is precharged toward a high voltage level. During the evaluate phase or cycle, the voltage level at the output node is evaluated, in which case it may remain at the high level or it may be driven down toward a low voltage or ground level, depending upon the inputs to the circuit and the circuit functional design. However, dynamic logic circuits are often highly sensitive to noise at their inputs. In some dynamic logic circuits, noise at the inputs can lead to a "false evaluate". This means the voltage at the output node may fail to fully charge due to noise at the inputs during the precharge phase before the circuit is ready to be evaluated. This could lead to false evaluate results during the evaluate phase or cycle which can affect the overall performance of the dynamic logic circuit. There are several prior art techniques for reducing noise sensitivity.

FIG. 1 illustrates a first prior art technique for reducing noise sensitivity in dynamic logic circuits. As shown in FIG. 1, a dynamic logic NAND gate is comprised of a number of transistors. A first P type transistor 102 is used to couple an output node O to a high voltage rail Vdd, in order to precharge a voltage level at the output node toward the high voltage rail Vdd when the clock signal CLK is low. This is known as the precharge phase or cycle.

Three N type transistors 103, 104 and 107 operate as a current flow or evaluate path for coupling the output node O to a low voltage or ground rail GND. During the evaluate phase or cycle, the clock signal CLK is high, which causes the first P type transistor 102 to turn off and the third N type transistor 107 to activate. Dependent upon the inputs A and B, the transistors 103 and 104 may activate during the evaluate phase or cycle, allowing current to flow from the output node O toward the low voltage or ground rail GND, thereby driving the voltage level at the output node back toward the low voltage or ground level GND.

In the prior technique for protecting the dynamic logic circuit from noise which is illustrated in FIG. 1, each input A and B into the dynamic logic circuit 101, is passed through a pair of inverters. Accordingly, the input A is passed through inverters 105a and 106a before it is coupled to the dynamic logic circuit 101. Likewise, the input B is passed through inverters 105b and 106b before it is coupled to the dynamic logic circuit 101. The use of an inverter pair for each input prevents moderate noise on either input A or B from activating the current flow or evaluate path between the output node O and the low voltage or ground rail GND before the inputs are valid. This ensures that the voltage level at the output node O is fully precharged to the high voltage level during the precharge phase or cycle.

The inverters will only allow the inputs A and B to the dynamic logic circuit 101 to trigger a discharge of current from the output node through the current flow or evaluate path if the inputs A and B are both at voltage levels above the activation levels of the inverters 105a–b and 106a–b. Therefore, the circuit 101 is not as susceptible or sensitive to noise at the inputs A and B because the two inverters in each inverter pair will not both activate when noise is present. However, use of the inverter pair at each input A and B slows down the proper operation of the dynamic logic circuit during the evaluate phase or cycle. The delay imposed through the use of a dual inverter configuration may be significant and is undesirable in most dynamic logic circuit design applications.

FIG. 2 illustrates a technique for reducing noise sensitivity in dynamic logic circuits using a NAND logic gate comprised of a number of transistors. A first P type transistor 202 is used to couple an output node O to a high voltage rail Vdd, in order to precharge a voltage level of output node O towards a high voltage rail Vdd when the clock signal CLK is low. This is known as the precharge phase or cycle.

Further, three different N type transistors 203, 204 and 207 are coupled together serially and operate as a current flow or evaluate path in order to couple the output node O of the dynamic logic circuit to a low voltage or ground rail GND. Two of the N type transistors 203 and 204 have their respective gates coupled to receive one of the two inputs A and B. The third N type transistor 207 has its gate coupled to receive the clock signal CLK.

As explained earlier, when the clock signal CLK is active, the circuit is in the evaluate phase or cycle. When this occurs, the first P type transistor 202 is turned off and the third N type transistor 207 is active. The inputs A and B may then activate the two other N type transistors 203 and 204; in which case, the voltage at the output node O will be driven toward the low voltage or ground rail GND.

In FIG. 2, the dynamic logic circuit is protected from noise at either of the inputs through the use of a pair of P type transistors 210 and 211. Each P type transistor has its source coupled to the high voltage rail Vdd and its drain coupled to the drain of one of the N type transistors (the P type transistor 210 has its drain coupled to the drain of the N type transistor 203, while the P type transistor 211 has its drain coupled to the drain of the N type transistor 204). Each P type transistor 210 and 211 has its gate coupled to receive one of the inputs A or B. The two P type transistors 210 and 211 are preferably configured to activate only when a voltage equal to or greater than one half of the voltage level at the high voltage rail Vdd is applied to the gate of either transistor. Accordingly, in one preferred embodiment, unless the inputs A and B are both at voltage levels greater than ½ Vdd. the voltage at the output node O remains fully charged. This protects the circuit from erroneously discharging if noise appears at either input A or B. It is understood, that the two P type transistors 210 and 211 may be adjusted to require higher turn-on or activation voltages in order to increase the level of noise protection provided.

The method for protecting against noise in dynamic circuits illustrated in FIG. 2 is more desirable than using the dual inverter design illustrated in FIG. 1 since it does not significantly delay operation of the circuit. However, this method will not work in all dynamic logic circuits. For example, this method will not work in dynamic logic OR gates or NOR gates. FIG. 3 illustrates a dynamic logic NOR gate which has no noise protection circuitry.

As shown in FIG. 3, the dynamic NOR gate 301 is comprised of a single P type transistor 305 which is coupled to three different N type transistors 306, 307 and 308 which are arranged in parallel. The P type transistor 305 has its source coupled to a high voltage source Vdd, its drain coupled to an output node O, and its gate coupled to receive a clock signal CLK as an input. The P type transistor 305 is activated whenever the clock signal CLK is low, and a voltage level at the output node O is driven toward the high voltage rail Vdd. This occurs when the NOR gate 301 is in the precharge phase or cycle.

The three different N type transistors 306, 307 and 308 are all coupled in parallel, such that each N type transistor has its drain coupled to the output node O, and its source coupled to a common node CN. The first N type transistor 306 has its gate coupled to receive an input signal A. The second N type transistor 307 has its gate coupled to receive an input signal B. The third N type transistor 308 has its gate coupled to receive an input signal C.

A fourth N type transistor 310 is coupled in series with the three different N types transistors 306, 307 and 308, between the common node CN and a low voltage or ground rail GND. The fourth N type transistor 310 has its drain coupled to the common node CN, its source coupled to the ground rail GND, and its gate coupled to receive the clock signal CLK. The fourth N type transistor 310 is active when the clock signal CLK is high or active. This occurs when the circuit is in an evaluate mode. The fourth N type transistor 310 n combination with the three different N type transistors 306, 307 and 308, forms three different current flow paths or evaluate paths from the output node O to the low voltage or ground rail GND. If either signal A, B or C is high or active during the evaluate mode, the corresponding current flow or evaluate path is activated and the voltage level at the output node O drops as current is drawn through the respective N type transistor in the three N type transistors 306, 307 and 308 and the fourth N type transistor 310 to the low voltage or ground rail GND.

If the voltage level of any of the inputs A, B, or C is high as a result of noise on that input and this noise occurs during the precharge phase or cycle, then the voltage level at the output node O may not fully charge to the appropriate high voltage level. This can lead to errors during the evaluate phase or cycle. More specifically, if there is sufficient noise at any of the inputs A, B or C, then that transistor where the noise occurs may activate, causing the current flow or evaluate path to operate during the precharge phase or cycle. This will cause current to leak from the output node O to the low voltage or ground rail GND through the respective current flow or evaluate path, thereby preventing the voltage at the output node O from fully charging to the proper high voltage level.

Unfortunately, the method of protecting the input lines which was previously discussed with reference to FIG. 2 will not work in this case. FIG. 4 illustrates the same NOR gate shown in FIG. 3; but, with the inputs A, B, and C protected in accordance with the prior art techniques discussed earlier. As shown, transistor 306 is coupled to receive input A and the input is protected using a P type transistor 315. The P type transistor 315 has its source coupled to the high voltage rail Vdd, its drain coupled to the drain of the N type transistor 306, and its gate coupled to receive the input A. The P type transistor maintains the voltage level of the output node O at a high voltage level until the NOR gate is in the evaluate phase or cycle, and unless the input A is valid. Similarly, transistor 307 is coupled to receive input B and the input is protected using a P type transistor 316. The P type transistor 316 has its source coupled to the high voltage rail Vdd, its drain coupled to the drain of the N type transistor 307, and its gate coupled to receive the input B. The P type transistor 316 maintains the voltage level of the output node O at a high voltage level until the NOR gate is in the evaluate phase or cycle, and unless the input B is valid. Finally, transistor 308 is coupled to receive input C and the input is protected using a P type transistor 317. The P type transistor 317 has its source coupled to the high voltage rail Vdd, its drain coupled to the drain of the N type transistor 308, and its gate coupled to receive the input C. The P type transistor 317 maintains the voltage level of the output node O at a high voltage level until the NOR gate is in the evaluate phase or cycle, and unless the input C is valid.

Figure 5:
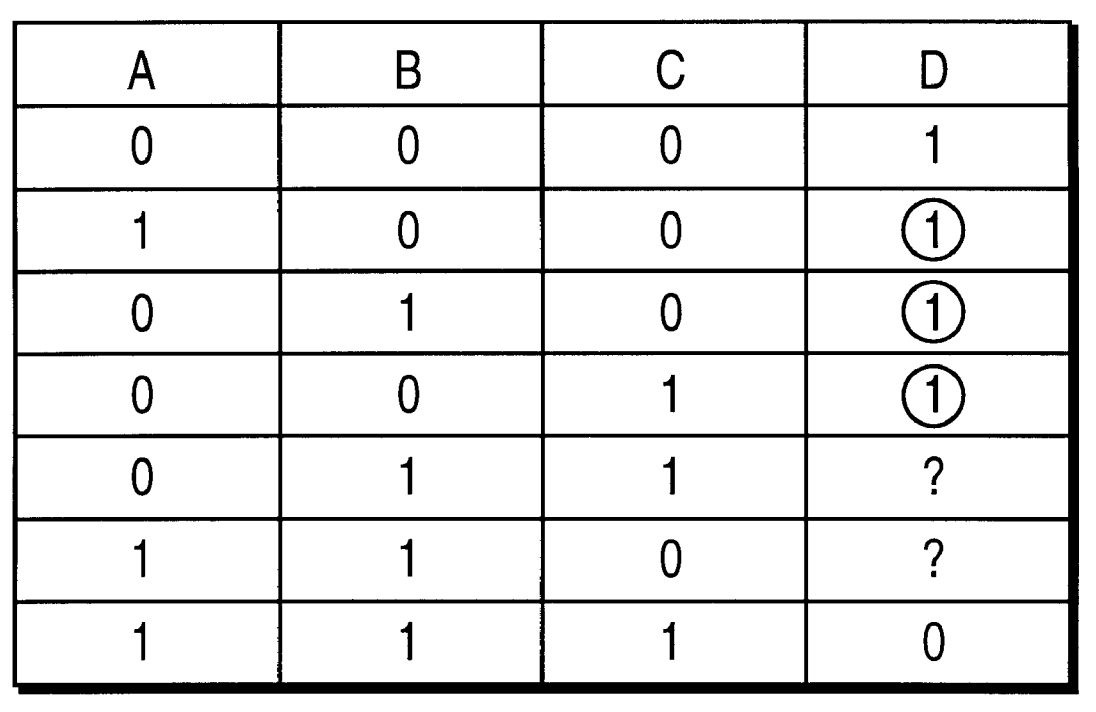

FIG. 5 shows a truth table which illustrates the problem with using the prior art technique discussed earlier. As shown in FIG. 5, if the inputs A and B are each at logic low voltage levels during the evaluate, but the input C is at a logic high voltage level, then the NOR gate should produce a logic low. However, if the inputs are protected in accordance with the prior art method discussed earlier, then the low voltage levels at the inputs A and B will actuate the P type transistors, thereby driving the voltage level at the output node toward the logic high voltage level. Additionally, in the case where only A is low and B and C are high, the output is unknown. This is because although the inputs B and C have actuated the second and third current flow path from the output node O to ground GND, the P type transistor 315 continues to try to drive the voltage level at the output node O toward the high voltage rail Vdd. Accordingly, the output voltage at the output node O will be at some unknown voltage level between the high voltage rail Vdd and the low voltage or ground rail GND. Thus, it is seen from analyzing the truth table of FIG. 5, that the prior art techniques used for reducing effects of noise at inputs in dynamic circuits will not work.

Accordingly, what is needed is an alternative method for protecting a dynamic circuit which may include logic OR gates or logic NOR gates from noise at the inputs to these gates without interfering with the proper operation of the circuit.

SUMMARY OF THE INVENTION

In accord with the present invention, a noise protection circuitry is disclosed for protecting a dynamic logic circuit having an output voltage at an output node from noise input signals to the circuit. The noise protection circuitry generally comprises: a first transistor coupled between the output node and a first current flow or evaluate path, wherein the first transistor is selectively activated by a first input signal during an evaluate phase, thereby allowing current to flow from the output node through the first current flow or evaluate path toward a low voltage or ground rail and causing the output voltage to drop; a second transistor opposite in polarity from the first transistor coupled between the first current flow or evaluate path, the first transistor, and the high voltage rail, wherein the second transistor is activated by the first input signal if the first transistor is not activated during the evaluate phase, thereby ensuring that current does not flow to the first current flow or evaluate path.

BRIEF DESCRIPTION OF THE DRAWINGS

FIG. 5 shows a truth table which illustrates the problem with using the prior art technique for protecting inputs to a logic NOR gate;

FIG. 7 shows a truth table which illustrates the operations of a NOR circuit including the noise protection circuitry of the present invention.

DETAILED DESCRIPTION OF PREFERRED EMBODIMENTS

Figure 1:
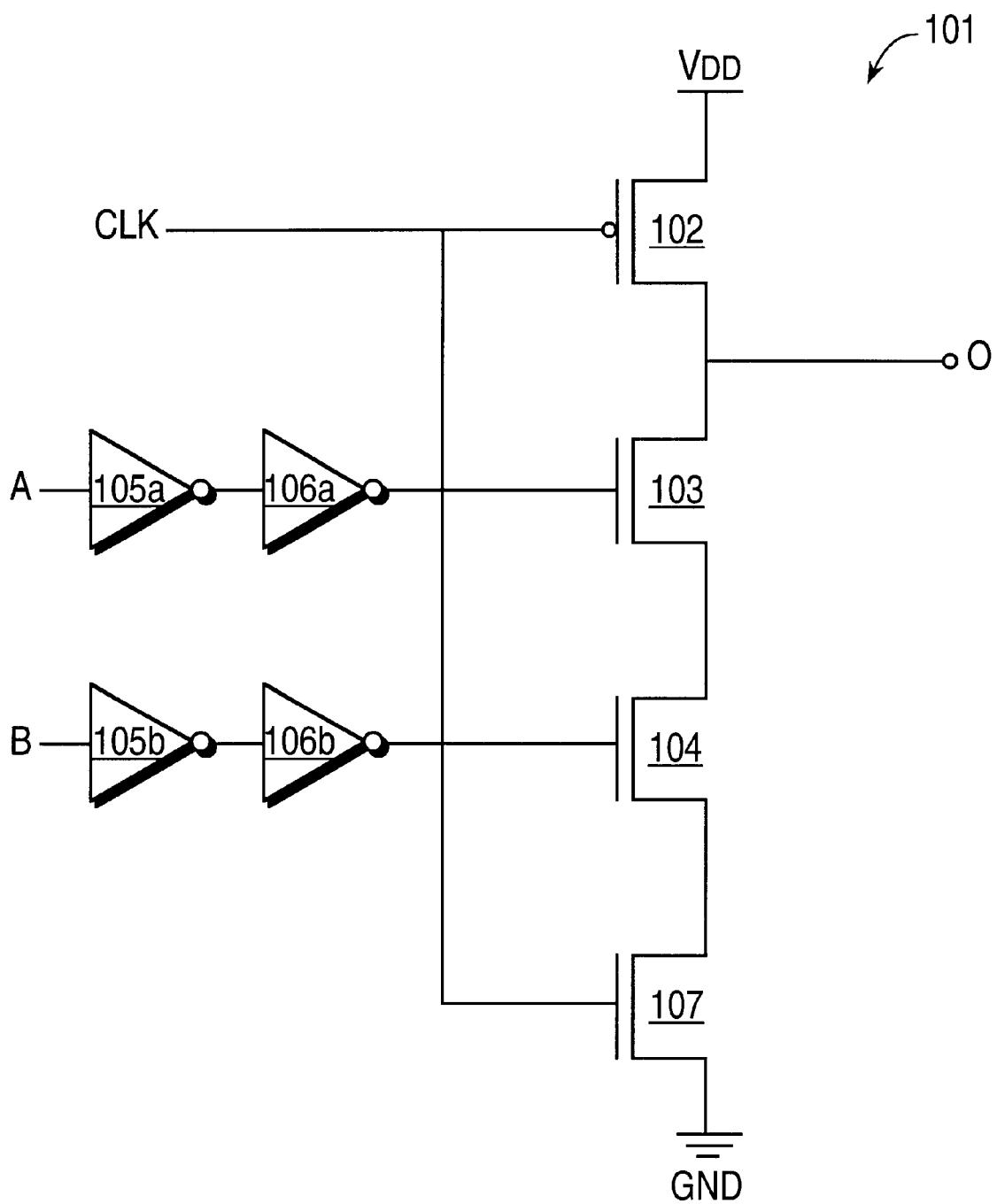
FIG. 1 illustrates a first prior art technique for reducing noise sensitivity in dynamic logic circuits.
Figure 2:
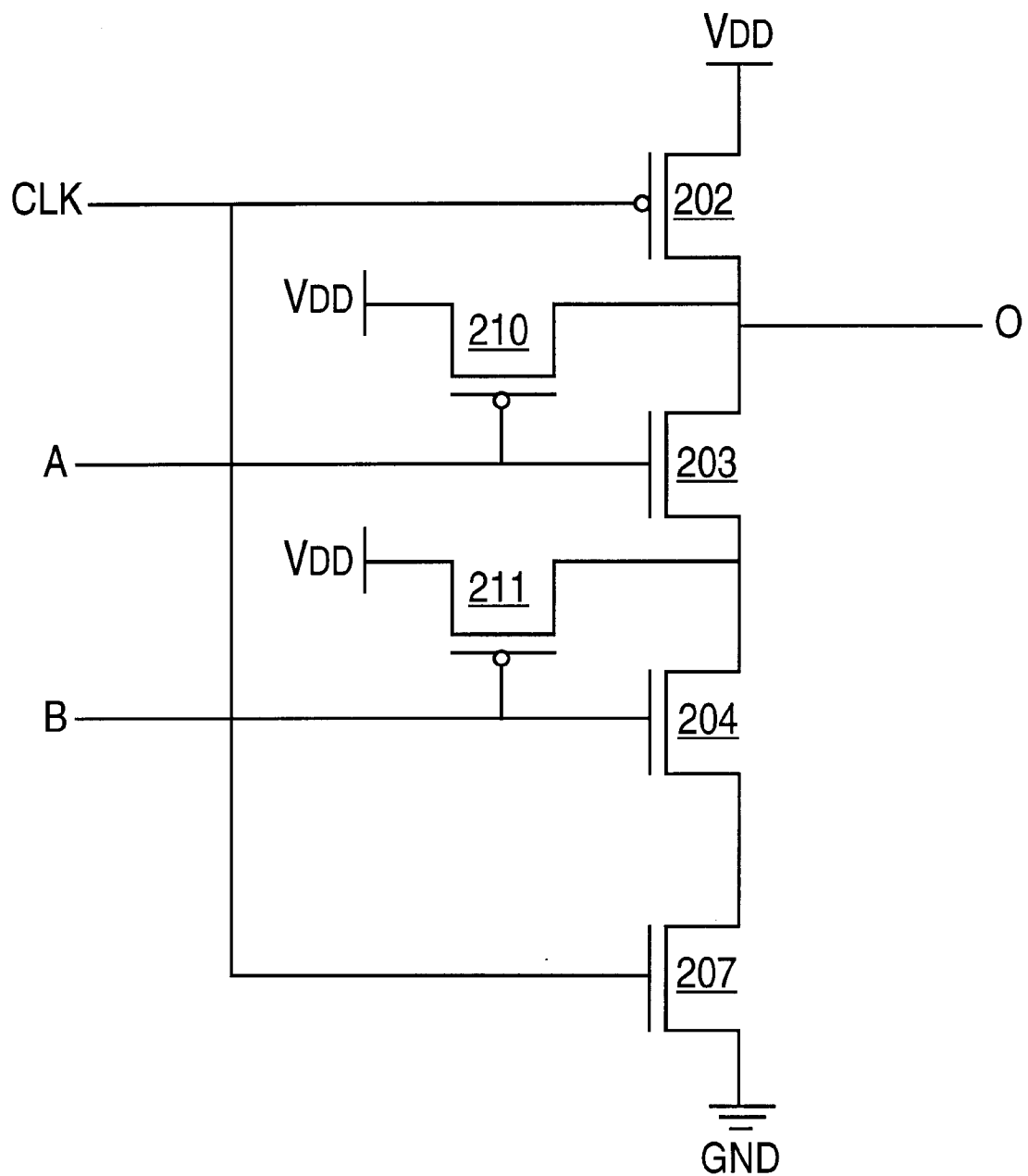
FIG. 2 illustrates an alternative prior art method for reducing noise sensitivity in dynamic logic circuits.
Figure 3:
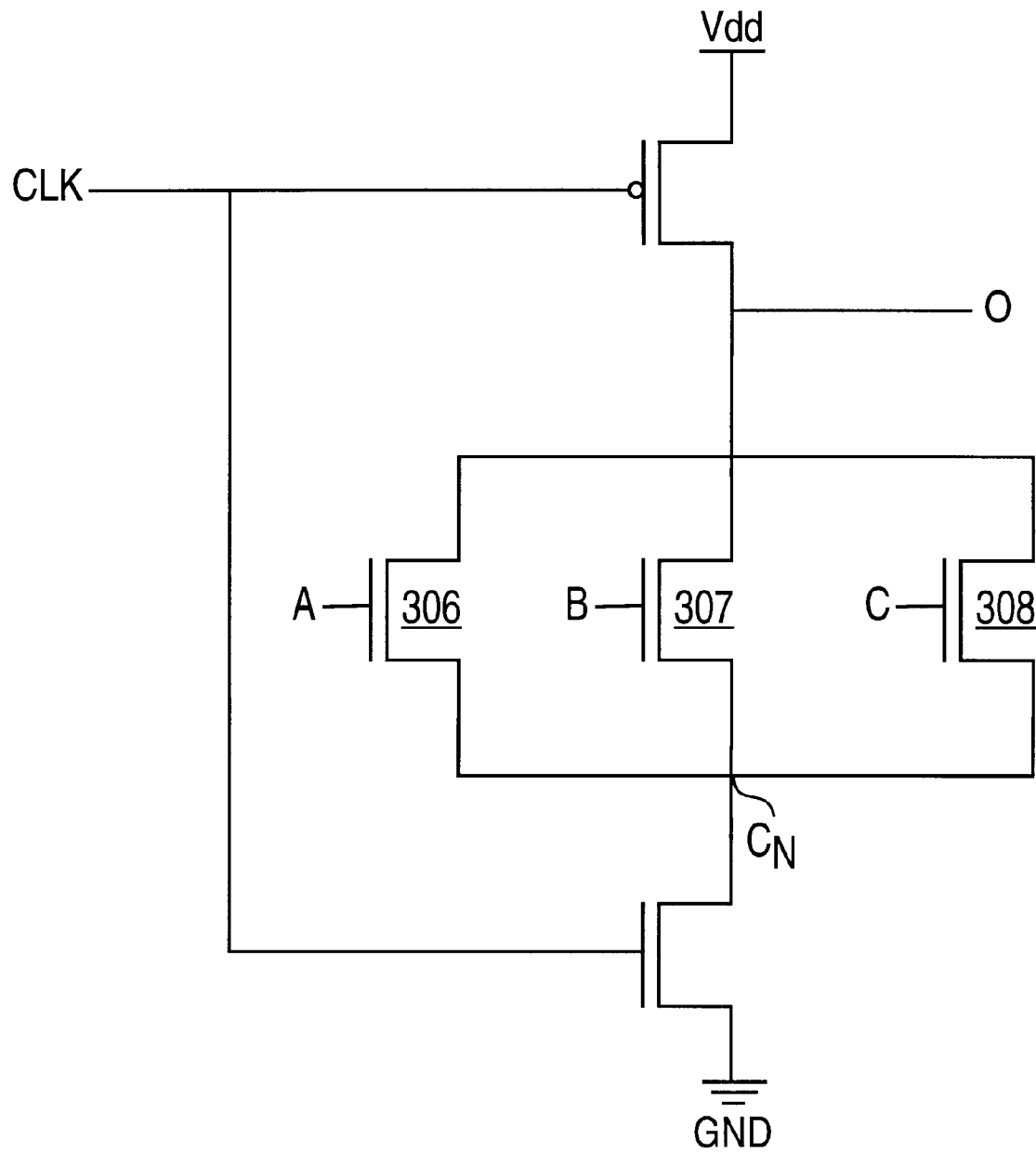
FIG. 3 illustrates a dynamic logic NOR gate.
Figure 4:
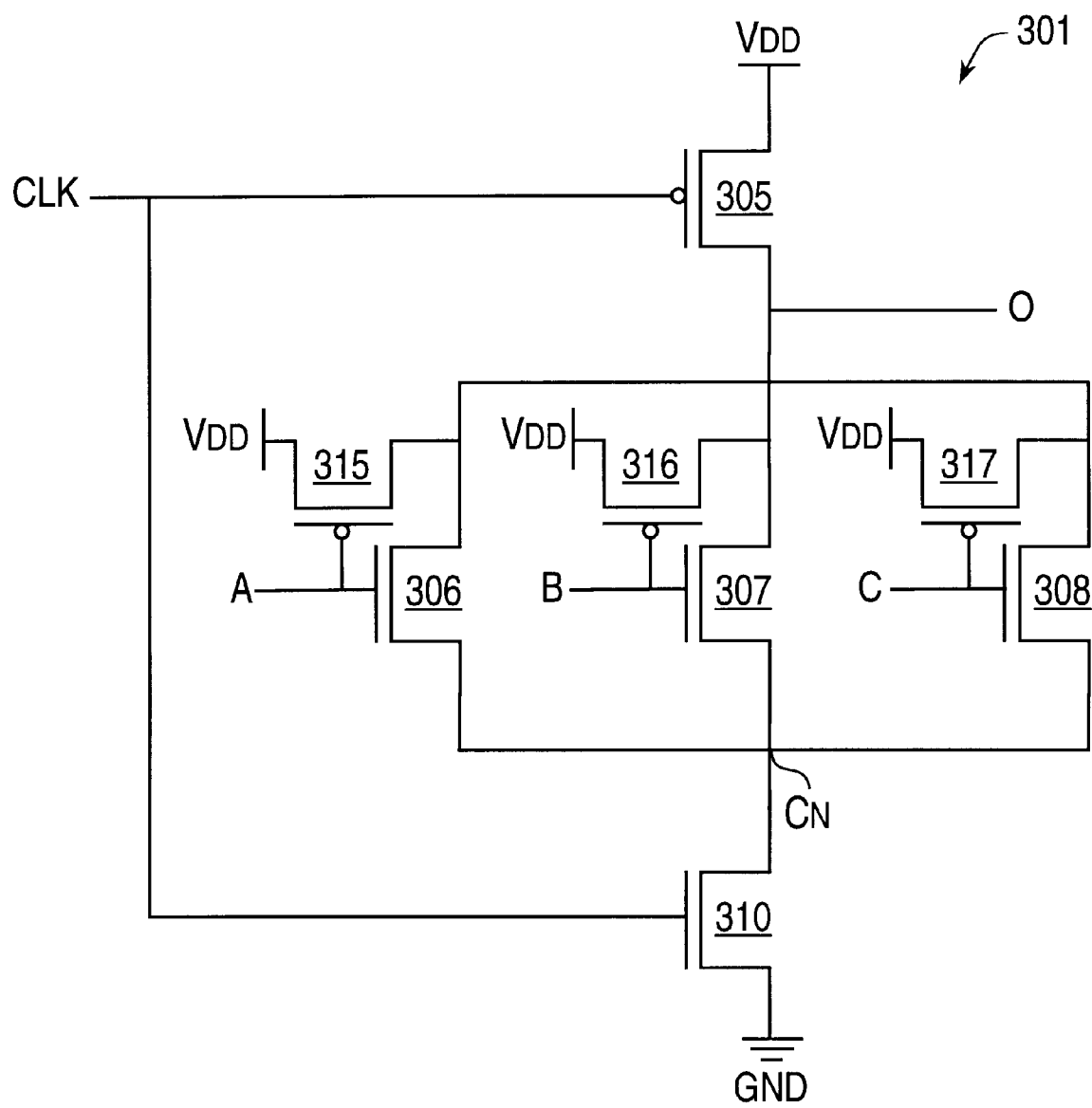
FIG. 4 illustrates the same NOR gate shown in FIG. 3 but, with the inputs A B and C protected in accordance with the prior art techniques discussed earlier.
Figure 6:
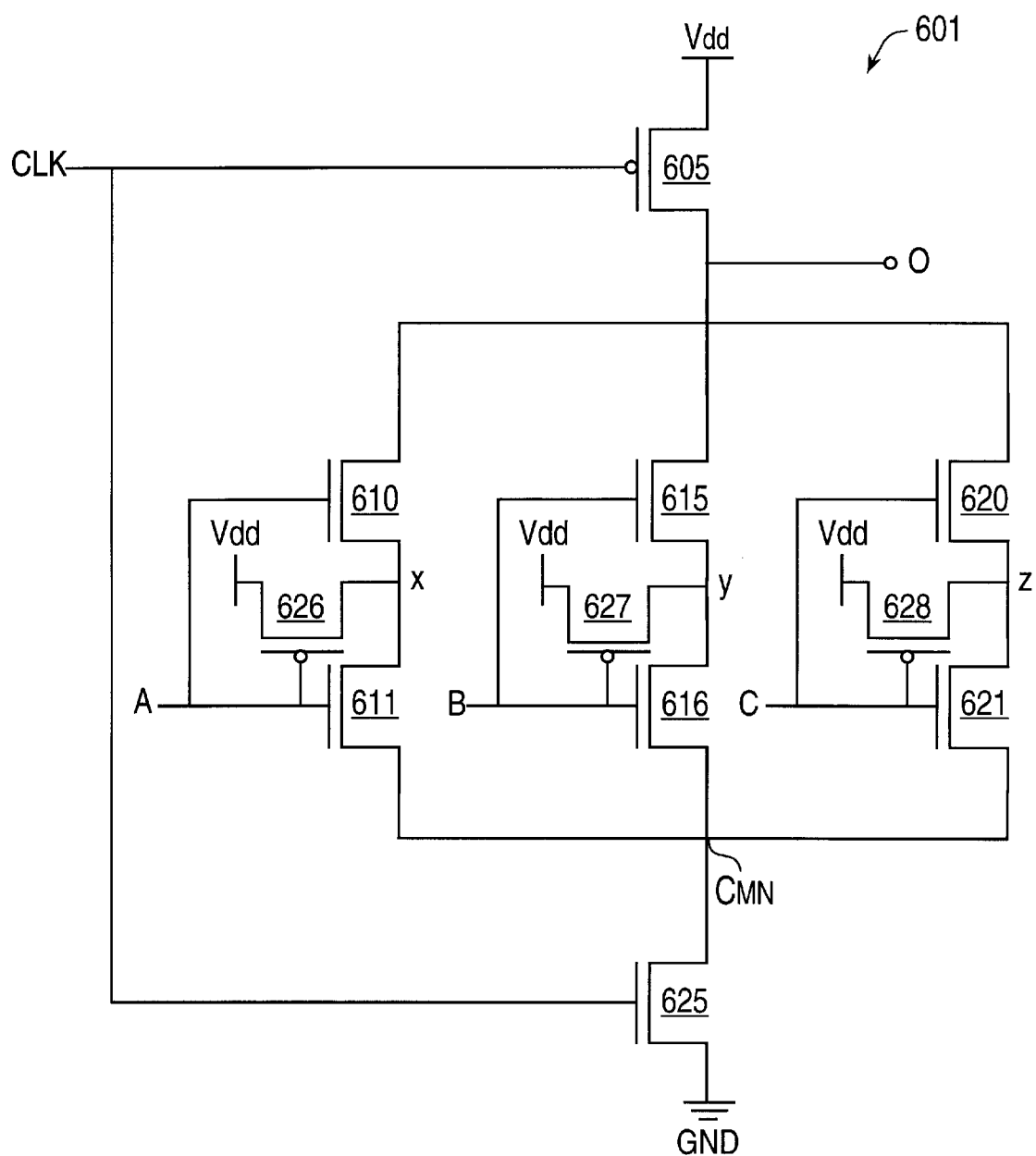
FIG. 6 shows a preferred embodiment of the noise protection circuitry of the present invention as used in a dynamic logic NOR circuit.

The present invention is a new method and apparatus for protecting dynamic logic circuits from the effects of noise at the inputs to the dynamic logic circuits. More specifically, the invention is ideal for use in OR, NOR and exclusive OR circuits, and protects these circuits from noise at any of the inputs, while maintaining the circuit integrity and operation. FIG. 6 shows a preferred embodiment of the present invention used in a dynamic logic NOR circuit 601.

As shown in FIG. 6, the dynamic logic NOR gate 601 consists of a P type transistor 605 coupled between a high voltage rail Vdd and an output node O. The gate of the P type transistor 605 is coupled to receive a clock signal CLK. When the clock signal CLK is low, the circuit is in precharge, the P type transistor 605 is turned on, and a voltage level at the output node O is driven toward the high voltage rail Vdd. The NOR gate 601 further includes three parallel current flow or evaluate paths which couple the output node O through a common node CMN to a low voltage or ground rail GND. Unlike the prior art, each of the three parallel current flow or evaluate paths includes an extra N type transistors (610, 615 and 620). As will be further explained, the use of an extra N type transistor in each current flow or evaluate path allows for the inputs to be protected while maintaining the operation and integrity of the circuit.

In the embodiment shown in FIG. 6, each current flow or evaluate path includes a first N type transistors 611, 616 and 621 which is coupled to receive one of the inputs and a second or extra N type transistor 610, 615 and 620 which is arranged in series with the first N type transistors 611, 616 and 621, such that a series pair of N type transistors exists in each current flow or evaluate path. Each transistor in the series pair is coupled to receive one of three inputs (A, B or C) at its gate. For example, a first N type series pair 610 and 611 which forms a first current flow or evaluate path is comprised of transistors 610 and 611 which are coupled in series and are each coupled to receive the input A at their respective gates. The second N type series pair 615 and 616 which forms a second current flow or evaluate path is comprised of transistors 615 and 616 which are coupled in series and are each coupled to receive the input B at their respective gates. Finally, the third N type series pair 620 and 621 which forms a third current flow or evaluate path is comprised of transistors 620 and 621 which are coupled in series and are each coupled to receive the input C at their respective gates.

An additional N type transistor 625 is coupled between the common node CMN and a low voltage or ground rail GND. The additional N type transistor 625 has its drain coupled to the common node CMN, its source coupled to the ground rail GND and its gate coupled to receive the clock signal CLK. When the clock signal CLK is high, the additional N type transistor 625 is active or on, allowing the circuit to evaluate the inputs A, B and C, in which case one or more of the current flow or evaluate paths may be activated, in which case current will flow from the output node O toward the low voltage or ground rail GND and the voltage level at the output node O will drop.

Each of the N type series pairs on the first, second and third current flow or evaluate paths is coupled to a P type transistor 626, 627 and 628. Each P type transistor 626, 627 and 628 is coupled between the two N type transistors in the respective current flow or evaluate path such that each P type transistor 626, 627 and 628 has its drain coupled between the two N type transistors in the respective series pair, its source coupled to the high voltage rail Vdd and its gate coupled to the respective input signal A B or C.

Accordingly, transistor 626 has its drain coupled between the first N type series pair 610 and 611 in the first current flow or evaluate path, its source coupled to the high voltage rail Vdd, and its gate coupled to receive the input A. Transistor 627 has its drain coupled between the second N type series pair 615 and 616 in the second current flow or evaluate path, its source coupled to the high voltage rail Vdd, and its gate coupled to receive the input B. Finally, transistor 628 has its drain coupled between the third N type series pair 620 and 621 in the third current flow or evaluate path, its source coupled to the high voltage rail Vdd, and its gate coupled to receive the input C.

Each P type transistor 626, 627, and 628, together with the first N type transistor in each N type series pair (transistors 610, 615 and 620) serve as protection circuitry which protect the dynamic logic NOR gate from noise at either of the inputs A B or C, while maintaining the operation and integrity of the circuit. When the circuit is in the precharge state, each P type transistor 626, 627 and 628, together with the first N type transistors in each N type series pair (transistors 610, 615 and 620) serve to protect the circuit from noise at any of the inputs A B or C.

For example, assume that A B and C are normally low until the evaluate phase or cycle. Further, assume that noise exists at the input A. Although the noise maybe sufficient to activate the N type transistors in the first N type series pair of the first current flow or evaluate path, the P type transistor 626 serves to maintain a high voltage level at the node X located between the first P and second N type transistors, 610 and 611 respectively, in the N type series pair of the first evaluate path. This prevents current from leaking through the first current flow or evaluate path, and maintains a high voltage level at the output node O until the beginning of the evaluate cycle. Similarly, assume that noise exists at the input B. Although the noise may be sufficient to activate the N type transistors in the N type series pair of the second evaluate path, the P type transistor 627 serves to maintain a high voltage level at the node Y between the first and second N type transistors in the N type series pair of the second evaluate path. This prevents current from leaking through the N type series pair and maintains a high voltage level at the output node O until the evaluate cycle. Finally, assume that noise exists at the input C. Although the noise may be sufficient to activate the N type transistors in the N type series pair 620 AND 621, the P type transistor serves to maintain a high voltage level at the node Z between the first and second N type transistors in the N type series pair 620 and 621 of the third evaluate path. This prevents current from leaking through the N type series pair in the third evaluate path and maintains a high voltage level at the output node O until the evaluate cycle. Accordingly, the use of the P type transistors operate to prevent noise from inadvertently activating the circuit and causing the voltage at the output node to drop before the evaluate stage or cycle.

Now, assume that the NOR gate is in the evaluate phase or cycle. In this phase or cycle, the clock signal CLK is active. Accordingly, the first P type transistor is inactive and the additional N type transistor, which is coupled between the common node CMN and the low voltage on ground rail GWD, is active. This allows the voltage level at the output level to be evaluated dependent upon the inputs A, B and C. FIG. 7 shows a truth table which illustrates the operations of a NOR circuit including the noise protection circuitry of the present invention.

Analyzing FIG. 7, one can see that despite the use of the P type transistors for noise protection, the dynamic logic NOR gate circuit operates properly. This is because the first N type transistor in each N type series pair prevents any of the inputs A, B or C from driving the output node high during the evaluate phase or cycle. For example, assume that during the evaluate phase or cycle that the input A is high while the inputs B and C are low. As explained previously, during the evaluate phase or cycle the clock signal CLK is high. This causes the first P type transistor to turn off and the additional N type transistor, which is coupled between the common node CMN and the low voltage on ground rail GWD, to activate. Furthermore, since in our assumption the input A is high, both N type transistors in the N type series pair of the first evaluate path will turn on, while the P type transistor which is coupled between the two N type transistors in the N type series pair will turn off. This will allow current to flow from the output node O, through the N type series pair of transistors and toward the ground rail GND, causing the voltage at the output node to drop toward the ground rail GND.

Since in our assumption B and C are both low, the N type transistors in the second and third N type series pairs will not turn on. Furthermore, the P type transistors coupled between each of the N type transistors in each of the second and third N type series pairs ensures that no current will inadvertently leak through either of these pairs without driving the output node O back toward the high voltage rail Vdd.

One can easily see that the present invention allows the circuit to be protected from noise at the inputs while maintaining the full integrity and proper operation of the dynamic logic NOR gate. Thus providing a significant advantage over prior art techniques used to protect such circuits from the effects of noise at their inputs.

What is claimed is:

1. Noise protection circuitry for protecting a dynamic logic circuit having an output voltage at an output node from noise at input signals to the circuit the noise protection circuitry comprising:

a first transistor coupled between the output node and a first current flow or evaluate path, wherein the first transistor is selectively activated by a first input signal during an evaluate phase and wherein the first current flow or evaluate path is comprised of at least one transistor which is activated by the input signal at the same time the first transistor is activated, thereby allowing current to flow from the output node through the first current flow or evaluate path toward a low voltage or ground rail and causing the output voltage to drop; and a second transistor, opposite in polarity from the first transistor, coupled between the first current flow or evaluate path, the first transistor, and a high voltage rail, wherein the second transistor is activated by the first input signal if the first transistor is not activated during the evaluate phase, thereby ensuring that current does not flow through the first current flow or evaluate path.

2. The noise protection circuitry of claim 1, wherein the output node is coupled to the high voltage rail through a precharge transistor which activates when the dynamic logic circuit is in a precharge phase, thereby causing the output voltage of the output node to increase toward the high voltage rail.

3. A dynamic logic gate comprising:

an output node coupled to a high voltage rail through a precharge transistor, which is activated during a precharge phase, thereby increasing a voltage level at the output node toward the high voltage rail;

first current flow path coupled from the output node to a low voltage rail for receiving a first input, wherein the first current flow path is selectively enabled during an evaluate phase dependent upon the first input, thereby allowing current to flow from the output node to the low voltage rail and causing the voltage level at the output node to drop;

a first noise protection transistor coupled between the first current path and the high voltage rail, wherein the first noise protection transistor ensures that the first current flow path is not enabled until the evaluate phase and unless the first input is valid and wherein the first current flow path is comprised of at least one transistor which is activated by the input signal at the same time the first transistor is activated; and a second noise protection transistor coupled between the first protection transistor and the output node, wherein the second noise protection transistor prevents the first noise protection transistor from driving the voltage level at the output node high during the evaluate phase.

4. The dynamic logic gate of claim 3 further comprising:

a second current flow path coupled from the output node to the low voltage rail for receiving a second input, wherein the second current flow path is selectively enabled during an evaluate phase dependent upon the second input, thereby allowing current to flow from the output node to the low voltage rail and causing the voltage level at the output node to drop;

a third noise protection transistor coupled between the second current path and the high voltage rail, wherein the third noise protection transistor ensures that the second current flow path is not enabled until the evaluate phase and unless the second input is valid; and a fourth noise protection transistor coupled between the third noise protection transistor and the output node, wherein the fourth noise protection transistor prevents the third noise protection transistor from driving the voltage level at the output node high during the evaluate phase.

5. The dynamic logic gate of claim 4, wherein the first noise protection transistor continues to ensure that the first current flow path is not enabled during the evaluate phase if the first input is not valid even if the second input is valid; and the third noise protection transistor continues to ensure that the second current flow path is not enabled during the evaluate phase if the second input is not valid even if the first input is valid.

6. A method for protecting a dynamic logic gate having an output node and at least first and second current flow paths from noise at the inputs to the gate, the method comprising:

coupling a first noise protection transistor between the first current flow path and a high voltage rail for receiving a first input at its gate, thereby ensuring that the first current flow path is not enabled until an evaluate phase and unless the first input is valid;

coupling within the first current flow path at least one transistor which is activated by the input signal at the same time the first transistor is activated; and coupling a second noise protection transistor, opposite in polarity to the first noise protection transistor, between the first noise protection transistor and the output node for receiving the first input at its gate, wherein the second noise protection transistor is selectively activated by the first input during an evaluate phase, thereby allowing current to flow from the output node and through the first current flow path, while preventing the first noise protection transistor from driving a voltage level at the output node high during the evaluate phase if the first noise protection transistor is activated during the evaluate phase.

7. The method of claim 6, further comprising:

coupling a third noise protection transistor between the second current flow path and the high voltage rail for receiving a second input at its gate, thereby ensuring that the second current flow path is not enabled until an evaluate phase and unless the second input is valid; and coupling a fourth noise protection transistor, opposite in polarity to the third noise protection transistor, between the third noise protection transistor and the output node for receiving the second input at its gate, wherein the fourth noise protection transistor is selectively activated by the second input during an evaluate phase thereby allowing current to flow from the output node and through the second current flow path, while preventing the third noise protection transistor from driving a voltage level at the output node high during the evaluate phase if the third noise protection transistor is activated during the evaluate phase.

8. The method of claim 7, wherein the first noise protection transistor continues to ensure that the first current flow path is not enabled during the evaluate phase if the first input is not valid even if the second input is valid; and the third noise protection transistor continues to ensure that the second current flow path is not enabled during the evaluate phase if the second input is not valid even if the first input is valid.

9. The dynamic logic gate of claim 4, wherein the second current flow path is comprised of at least one transistor which is activated by the second input signal at the same time the third transistor is activated.

10. The method of claim 7, further comprising:

coupling within the second current flow path at least one transistor which is activated by the second input signal at the same time the third transistor is activated.

* * * * *